United States Patent
Flakne et al.

(10) Patent No.: US 6,219,029 B1
(45) Date of Patent: *Apr. 17, 2001

(54) EMPHASIZING INFREQUENT EVENTS IN A DIGITAL OSCILLOSCOPE HAVING VARIABLE INTENSITY RASTERIZER AND VARIABLE INTENSITY OR COLOR DISPLAY

(75) Inventors: Dawn G. Flakne, Portland; Eric P. Etheridge, Beaverton; Roy I. Siegel, Portland, all of OR (US)

(73) Assignee: Tektronix, Inc., Beaverton, OR (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/054,862

(22) Filed: Apr. 3, 1998

(51) Int. Cl.[7] ....................................... G09G 5/10
(52) U.S. Cl. ............................. 345/147; 345/143
(58) Field of Search ................... 345/134, 133, 345/147, 148, 149; 364/487

(56) References Cited

U.S. PATENT DOCUMENTS

| | | | |
|---|---|---|---|
| 4,743,844 | * 5/1988 | Odenheimer et al. | 324/121 R |
| 4,829,293 | * 5/1989 | Schlater | 340/722 |
| 4,875,484 | * 10/1989 | Anzai et al. | 128/421 |
| 4,940,931 | 7/1990 | Katayama . | |
| 5,053,684 | * 10/1991 | Nooyen | 315/392 |
| 5,123,034 | * 6/1992 | Grujon | 377/19 |
| 5,250,935 | * 10/1993 | Jonker et al. | 345/134 |
| 5,254,983 | 10/1993 | Long . | |
| 5,387,896 | 2/1995 | Alappat . | |
| 5,412,579 | 5/1995 | Meadows . | |
| 5,440,676 | 8/1995 | Alappat . | |
| 5,491,496 | * 2/1996 | Tomiyasu | 345/147 |
| 5,530,454 | 6/1996 | Etheridge . | |
| 5,640,469 | * 6/1997 | Lewins et al. | 382/274 |
| 5,844,532 | * 12/1998 | Silverbrook et al. | 345/89 |
| 5,929,842 | * 7/1999 | Vertgret et al. | 345/147 |

* cited by examiner

*Primary Examiner*—Bipin Shalwala
*Assistant Examiner*—Vanel Frenel
(74) *Attorney, Agent, or Firm*—Boulden G. Griffith; Thomas F. Lenihan

(57) ABSTRACT

A new oscilloscope design improves the processing of acquired voltage-versus-time data through the efficient high speed acquisition and rasterization of such data into a form that includes multiple-bits-per-pixel intensity information. The multi-bit-per-pixel variable intensity rasterizer is optimized for maximum throughput and most efficient use of memory bandwidth. In the presence of faltering trigger rates, rasterization interruption provides a high probability of capturing the data associated with the slow triggers. Circuitry is provided to compensate for acquisition time and amplitude non-linearities. Many-bits-per-pixel intensity information is mapped into a fewer-bits-per-pixel format by a controllable transfer function that provides multiple viewing capabilities for the operator. Another mode of operation emphasizes infrequent events over commonly occurring ones using variations in brightness or color.

5 Claims, 6 Drawing Sheets

EMPHASIZING INFREQUENT EVENTS IN A DIGITAL OSCILLOSCOPE HAVING VARIABLE INTENSITY RASTERIZER AND VARIABLE INTENSITY OR COLOR DISPLAY

FIELD OF THE INVENTION

This invention relates to the processing of acquired voltage-versus-time data representative of the activity of a signal under observation into a form that is suitable for display by a digital oscilloscope, and more particularly to the efficient high speed acquisition and rasterization of such data into a form that includes multiple-bits-per-pixel intensity information for variable intensity or color displays, and reducing many-bits-per-pixel intensity data to a fewer-bits-per-pixel form according to an operator controlled transfer function that provides display alternative choices

STATEMENT REGARDING FEDERALLY SPONSORED RESEARCH AND DEVELOPMENT

Not Applicable

BACKGROUND OF THE INVENTION

Digital oscilloscopes generally use raster scan displays to present the activity of electrical signals to their users. Each raster scan display, such as those seen every day on computer screens, consists of a two dimensional array of pixels, with each pixel location being uniquely defined by a row number and column number. The simplest and lowest cost versions of such displays are "single bit" displays, in that the memory from which they derive the information to be displayed only has one bit of intensity information associated with each pixel. In such a display that single bit of information determines whether the pixel associated with it is either "on" or "off", with "on" dictating that a predetermined amount of intensity is to be used to illuminate the pixel and "off" indicating that the pixel is not to be illuminated at all.

The more complex and expensive alternative to a single bit display is a multi-bit display, which can provide variable intensity (also known as "gray-scale") or color variations as a substitute indicator of brightness. The memory locations associated with each pixel of a variable intensity display contain multiple bits of intensity information, indicating the number of varying intensity levels with which they can be illuminated. Like the pixels of single bit displays, those of multi-bit displays can exhibit an "off"=0 or dark state, but instead of one value of illumination, they have multiple values. Typically, the number of values available is $2^N-1$, where N is the memory depth at each address of the raster memory. Thus, for example, a four bit deep raster scan memory can support fifteen levels of partial through maximum illumination, as well as the dark or "off" state. Pixel intensity can also be translated into differing colors, as well as intensity or "brightness".

With this larger amount of data, multi-bit displays can convey more information about the behavior of electrical signal waveforms under observation, particularly if the signal is not perfectly repetitive and therefore has less activity in some portions than others. U.S. Pat. No. 4,940,931 to Katayama et al. for "Digital Waveform Measuring Apparatus Having A Shading-tone Display", hereby incorporated by reference, describes a system for producing digital variable intensity displays.

Typically, digital oscilloscopes acquire information about the behavior of a circuit node by periodically sampling the voltage present at the node. The oscilloscope probe tip is placed in contact with the node and the probe and front end of the oscilloscope precisely replicate the signal, or some predetermined fraction or multiple of the signal, and present it to an analog-to-digital converter. The output of the analog-to-digital converter is a series of multi-bit digital words that are stored in an acquisition memory. Successively acquired samples are stored at sequentially related addresses in the acquisition memory, and are thereby related to a time scale. Those addresses will eventually be converted back to a time scale, one of which is represented as horizontal distance along the x-axis of the oscilloscope's raster scan display.

In a typical digital oscilloscope, voltage amplitude values derived from the data contents of an acquisition memory location determine the vertical location (row number) of an illuminated pixel, while time values derived from the addresses of the acquisition memory determine the horizontal location (column number). The process of expanding the contents and addresses of an acquisition memory to produce contents for a two dimensional raster memory is known as "rasterization".

The output of a rasterization process is usually combined with some preexisting content of a raster memory, and the resulting composite raster contents may thereafter be regularly subjected to some sort of decay process. For more information about digital persistence and decay, refer to the following U.S. patents, hereby incorporated by reference: U.S. Pat. No. 5,440,676 to Alappat et al. for "Raster Scan Waveform Display Rasterizer With Pixel Intensity Gradation"; U.S. Pat. No. 5,387,896 to Alappat et al. for "Rasterscan Display With Adaptive Decay"; U.S. Pat. No. 5,254,983 to Long et al. for "Digitally Synthesized Gray Scale For Raster Scan Oscilloscope Displays".

For any particular combination of settings of the oscilloscope display and acquired waveform data, there will be some function that maps the acquired data points into the time (x-axis) versus voltage (y-axis) display raster. That mapping function will include some ratio between the number of samples to be mapped and the number of pixel columns in the raster display. While that ratio can be 1:1, it will usually be N:1 or 1:N If there are more data points than columns of pixels into which they must be mapped, some form of data compression and/or decimation will be utilized. Decimation means discarding all but every Nth data point, thereby forgoing part of the available information. Compression, on the other hand, means mapping data from multiple time locations in the acquisition memory into one horizontal location, i.e., a single column of pixels, in the raster scan display. If there are fewer data points than columns of pixels, i.e., the 1:N case above, then some sort of interpolation or equivalent time sampling is generally used. In the case of the present inventions, equivalent time sampling, which will be discussed in much greater detail below, is used.

For many years, digital oscilloscopes were limited in the percentage of activity at the probe tip that they effectively processed and displayed for the user. Although less sophisticated users and those who were only familiar with analog oscilloscopes had the impression that they were seeing most or all of the activity at their digital oscilloscope's probe tip, in many circumstances the display was really only showing a small percentage of the actual activity occurring there. This was because these oscilloscopes spent a lot more time processing signals than they did acquiring them. If a signal is perfectly repetitive, this loss of "live time" is not a problem, since one waveform looks just like another. However, when a signal is displaying some sort of intermittent anomalous behavior, a low percentage of live time may prevent such an anomaly from being detected. Therefore, increasing the waveform throughput and the percentage of signal activity at the probe tip that can actually be observed by the user has increasingly been the goal of the more recent digital oscilloscope designs. U.S. Pat. No. 5,412,579 to Meadows, et al. for "Slow Display Method for Digital Oscilloscope With Fast Acquisition System", hereby incorporated by reference, describes an oscilloscope system in which acquisitions are composited into alternating (also known as "ping-ponging") display buffers, so that while the contents of one display buffer is being used as the source of data being displayed, the other one is being used to gather and composite more data. However, the slow display of the design described in this patent only provided a single bit of intensity data per pixel and therefore had no analog-like gray scaling, i.e., variable intensity, capability.

The capability of processing a large number of waveforms is a highly desirable feature in a digital oscilloscope. U.S. Pat. No. 5,530,454 to Etheridge et al. for "Digital Oscilloscope Architecture For Signal Monitoring With Enhanced Duty Cycle", herein incorporated by reference, describes an oscilloscope that is capable of acquiring up to 400,000 waveforms per second when each waveform record is short and the frequency of trigger events is high enough. This oscilloscope somewhat emulates analog oscilloscope performance with a "live time" percentage that varies from about 6% to nearly 99%, depending on the timebase settings, number of channels turned on, and trigger event availability.

The speed of the architecture described in the Etheridge '454 patent was attained by using two raster memories, one in the acquisition system and the other in the display system. The first of these raster memories, referred to as the "raster acquisition memory", was almost constantly supplied with acquired waveforms. These waveforms were rasterized and composited into this raster acquisition memory nearly as quickly as they were acquired by a high speed acquisition rasterizer and similarly rapid image combiner. After many waveforms had been thus composited, the contents of the single-bit per pixel raster acquisition memory was transferred to a multiple-bit-per-pixel display raster memory, where it was combined with previously displayed data. The contents of that display raster memory were subject to a digital persistence control, such as that described above, and the intensity of each pixel was thereby decayed over time.

For many users, especially those having some experience with analog oscilloscopes, variable brightness usefully communicates information about the activity of the signal being observed. Many of these users have had a strong preference for some behaviors that resemble those of analog oscilloscopes. For example, as an analog oscilloscope generates vertical excursions during a horizontal sweep interval to provide a real-time picture of the signal activity at the probe tip, they inherently tend to vary the brightness of the display as an inverse function of the slope of the line they produce. This occurs because the cathode electron gun of the CRT generates a constant supply of electrons that depends on the setting of a "brightness" control, and the length of the trajectory covered in a unit of time is minimally determined by the x-axis distance associated with any particular sweep speed, but is increased by any and all y-axis excursions. And a y-axis excursion can be a large multiple of the corresponding x-axis distance, so the constant available electron beam energy can be reduced by a large factor as it is spread over this much longer distance. Thus, analog oscilloscopes inherently vary the brightness of the line they draw as an inverse function of the slope of that line.

Another even more highly desired feature of an analog oscilloscope or a digital oscilloscope with a high waveform throughput, is the ability to detect an intermittent signal anomaly that occurs in an otherwise repetitive signal. Older digital oscilloscopes, with low "live time" make observing intermittent signal activity improbable, at least in the absence of special trigger modes designed to detect certain classes of intermittent signal activity. Analog oscilloscopes will show a faint trace indicating the presence of this intermittently anomalous signal behavior. Of course, if the signal becomes too intermittent, the trace will be so faint in brightness that it may be missed entirely by the oscilloscope operator.

[45] However, performing a linear intensity accumulation of the acquired data, according to the rasterization method described below, means that the general level of accumulated intensities is directly proportional to the number of acquisitions accumulated. This raster is periodically cleared or decayed each time the screen is updated. If the time between updates is not constant, as it frequently may not be due to other processor activity, other display activity, or data dependent raster copying times, a fixed scaling of the accumulated acquisition raster memory contents can lead to observable, non-signal related intensity variations. Also, if an exponential decay is applied to the accumulating acquisition raster memory contents between display updates, there will be an initial transient build up of overall intensities in the map until a status quo is reached. These effects are all unwanted artifacts that it would be desirable to eliminate.

Moreover, while a linear accumulation of acquisitions into intensity variations is the easiest to produce at the rasterizer end of the process, an optimal presentation from the user's perspective might be more non-linear. For example, the user might sometimes be strongly focused on the most infrequent events and therefore might want all non-zero pixels to be mapped to the brightest intensity that the display can produce. Alternatively, there might be a certain region of pixel hit rates, and corresponding accumulated intensity, that the user would like to map to the full dynamic range of intensity available in order to more clearly distinguish subtle differences in the frequency at which they are being affected by acquired data. What is further desired is to be able to selectively visually emphasize infrequent events in order to make it easier for an oscilloscope user to analyze them.

BRIEF SUMMARY OF THE INVENTION

In accordance with the present invention, a method is provided for emphasizing infrequent events in variable intensity displays of waveform images. First, variable intensity raster memory contents representative of the behavior of a plurality of successive instances of an electrical waveform's behavior are produced by rasterizing and compositing a large number of waveforms. This waveform behavior is predominantly repetitive, but includes some instances in which the behavior is at least partially variant with respect to the majority case. The highest intensity values of the raster memory contents produced are at least partially associated with highly repetitive occurrences of identical waveform images, while the lowest intensity values are at least partially associated with the relatively more rare occurrences of variant versions of the waveform image. In a normal mode of display presentation, the raster memory contents are provided directly to a raster display system for presentation to a user, with the brighter areas of the display indicating the most common signal behaviors and the least bright areas indicating the most infrequent signal behaviors. As a function of the invention, however, an alternative mode of operation is provided in which low intensity values are converted to higher intensity and high intensity values are converted to low intensity, and these converted intensity values are then displayed as an aid to assist the user in identifying and analyzing infrequently occurring waveform events. More complex functions, implemented using a look-up table or tables, for example, allow the user to select any particular frequency of occurrence for emphasis.

BRIEF DESCRIPTION OF THE SEVERAL VIEWS OF THE DRAWING

FIG. 5 is a simplified block diagram showing where in the display preparation process intensity mapping and infrequent events emphasis according to the present invention are applied.

DETAILED DESCRIPTION OF THE INVENTION

Figure 1:
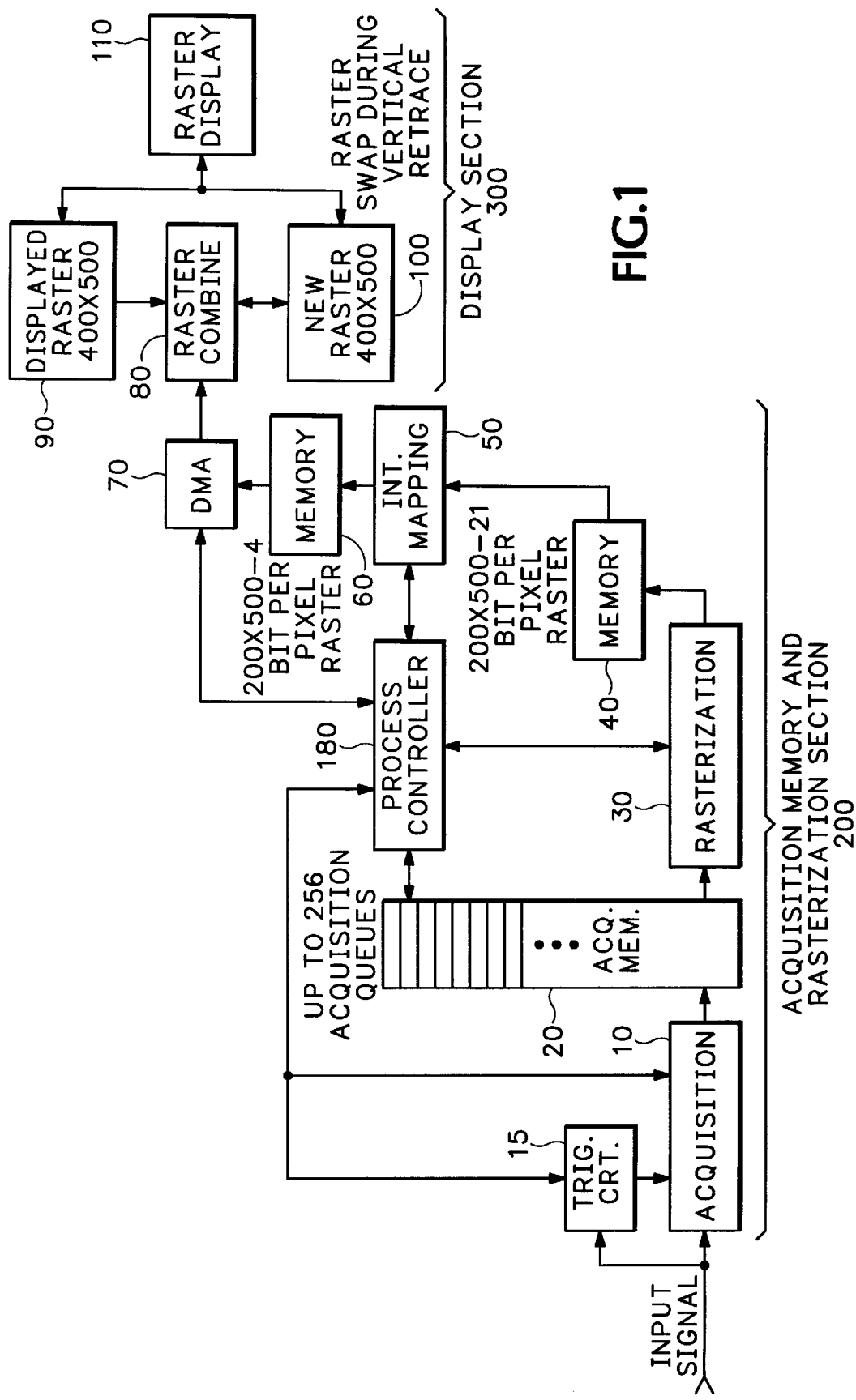
FIG. 1 is a simplified block diagram of the flow of acquired data as it moves through the acquisition memory and rasterization section and into the display section of an oscilloscope.

Referring first to FIG. 1, we see a simplified block diagram of the flow of acquired data as it moves through the acquisition memory and rasterization section 200 and into the display section 300 of an oscilloscope according to the present invention. Vertical scaling and vertical offset functions are applied prior to digitizing, and are therefore not directly visible in this figure, but rather are part of the acquisition process-10. The trigger circuitry 15, under the direction of the process controller 180, monitors the input signal and other criteria (not shown) and communicates the occurrence of the satisfaction of the trigger conditions to the acquisition circuitry 10 and the process controller 180.

The process controller 180 contains timers and state machines that allow it to control all of the acquisition and rasterization process, including some of the optional processes that will be discussed below and are not shown in FIG. 1. As can be seen, it sends command and information to, and receives various signals from, almost every part of the acquisition memory and rasterization section 200 as well the trigger 15 and acquisition circuitry 10. It notifies the raster combiner 80 when data is ready. The process controller 180 monitors the trigger circuitry 15 and starts the acquisition circuitry 10 and the rasterizer 30 at appropriate times, i.e., when there are enough acquisitions to rasterize or else so much time has elapsed from the first trigger or the last display update that new data is due at the display 110.

When data is due at the display 110, the process controller 180 starts the intensity mapping 50 and subsequently the DMA circuitry 70. As will be discussed in more detail below, the process controller 180 also determines when acquisition aborts are necessary, causes a trigger position calculator to run, and computes breakpoints.

As the output of the acquisition process 10, voltage-versus-time data-address pairs are stored in an acquisition memory 20. Acquisition memory 20 can hold two waveform records that are up to 512K samples long, or may be partitioned to hold up to 256 shorter waveform records each containing 768 samples. Each sample location contains 8 bits of information defining one of 256 possible voltage amplitude levels. 200 of these voltage amplitude levels correspond to one of the 200 pixel locations in each column of the 21-bit-per-pixel 200×500 acquisition raster memory 40.

Each acquisition memory and rasterization section 200 can acquire 100,000 waveform records per second, with each record containing 500 data points, and with each data point acquired at 1 ns intervals, for a total of 500 ns per acquisition. Multiple acquisition memory and rasterization sections 20, specifically two or four, can be interleaved together to double or quadruple the overall throughput available on one oscilloscope channel. The raster combiner 80 of the display section 300 can multiplex the outputs of these multiple acquisition memory and rasterization sections 20 back together in the display section 300.

Conversely, more than one channel can be multiplexed into one acquisition memory and rasterization section 200. And an alternative version of the raster combiner 80 can demultiplex these multiple channels out of fewer acquisition memory and rasterization sections 200 and, through the use of extra "tag" bits in each pixel location of the display raster memories 90 and 100, cause them to be displayed as separate channels on the raster display 110. The tag bits allow the channels to be prioritized, or "layered", so that only the intensity of the one on top is displayed when two or more channels overlap. Alternatively, the intensities from two or more channels can be added together when they overlap, if so desired.

The raster combiner 80 can also be made to translate intensity variations into color variations, with appropriate supportive changes being made in the display raster memories, 90 and 100, and the raster display 110, if needed.

Figure 2:
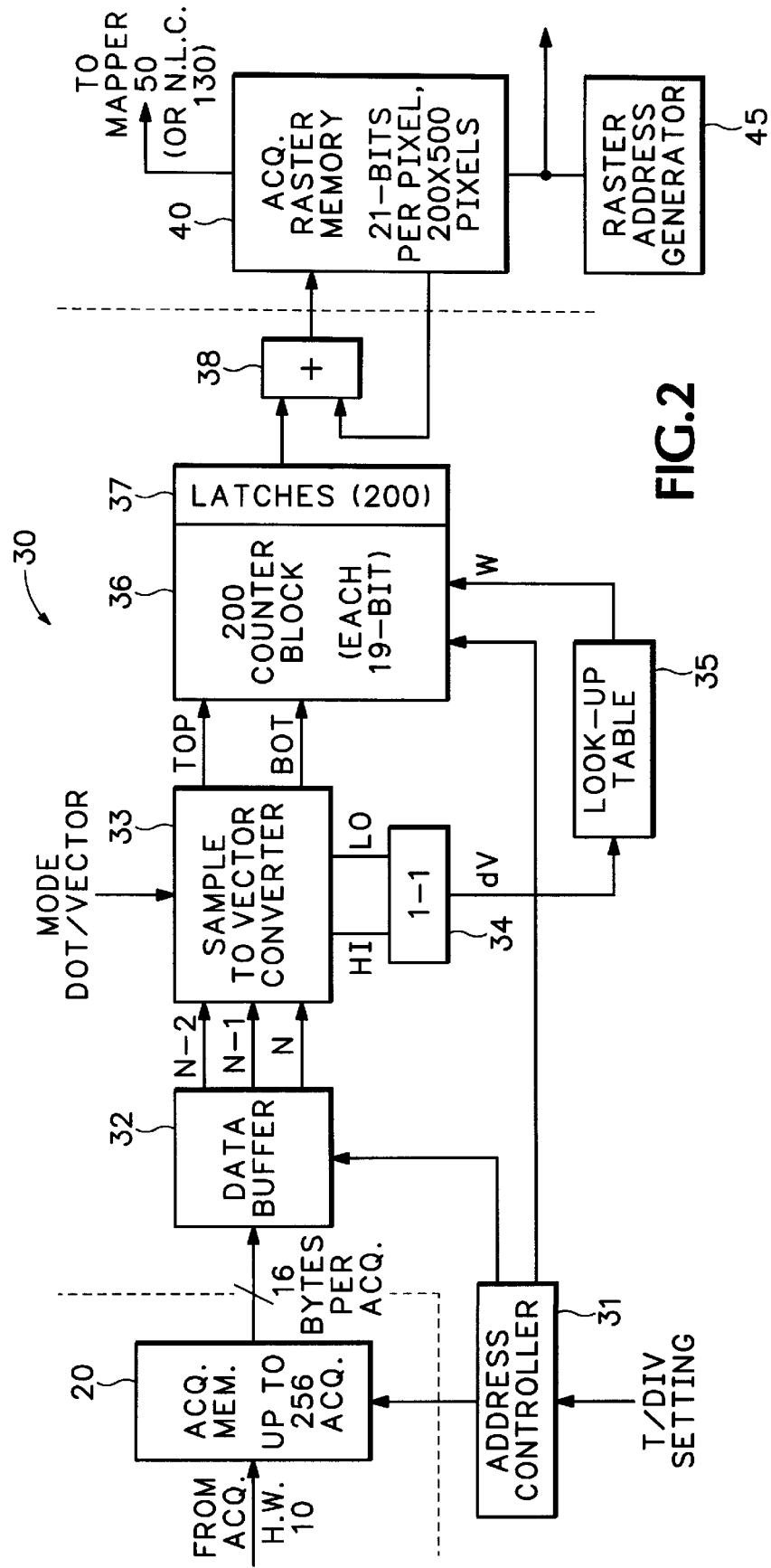
FIG. 2 is a block diagram showing how the rasterization process operates on data supplied by the acquisition memory and produces data for the acquisition raster memory.

Referring next to FIG. 2, please note that, for simplicity's sake, clock and timing signals, and control signals from the process controller 180 are not shown in this figure. The rasterization process 30 accesses appropriate samples from the acquisition memory 20 according to the addresses generated by the address controller 31. The address controller 31 receives time-per-division settings and is preprogrammed with part of the information shown in Table 1. It is thereby able to convert those time-per-division settings into addresses that reflect the desired combination of compression width and acquisition depth that will be included in the determination of the intensity for each pixel. The rest of the contents of Table 1 are known to the process controller 180.

The address controller 31 fetches acquisition data as directed by the process controller 180 (shown in FIG. 1), while providing sequential sample offsets and buffer selection information to the data buffer 32. The address controller 31 also identifies the end of each column so that the counter block 36 can be reset and latched appropriately. These controls, in effect, pass alongside the data pipelines so that the control tracks the flow of the data. When the raster updating takes longer than the compression process, the compression process is suspended at the end of the then current compression operation.

compression that will be performed during the rasterization process. It is the combination of these factors, expansion and compression, and those from the preceding column, equiva-

TABLE 1

TIME/DIVISION PROGRAMMING

| Index # | Time-Per-Division | Count | Size | Used | E.T. or Decimation | Expand/Compress |
|---|---|---|---|---|---|---|
| 0 | 200 ps | 256 | 768 | 2 | Equiv. Time = ON | Expand = 250 |
| 1 | 250 ps | 256 | 768 | 2 or 3 | Equiv. Time = ON | Expand = 200 |
| 2 | 500 ps | 256 | 768 | 5 | Equiv. Time = ON | Expand = 100 |
| 3 | 1 ns | 256 | 768 | 10 | Equiv. Time = ON | Expand = 50 |
| 4 | 2 ns | 256 | 768 | 20 | Equiv. Time = ON | Expand = 25 |
| 5 | 2.5 ns | 256 | 768 | 25 | Equiv. Time = ON | Expand = 20 |
| 6 | 5 ns | 256 | 768 | 50 | Equiv. Time = ON | Expand = 10 |
| 7 | 12.5 ns | 256 | 768 | 125 | Equiv. Time = ON | Expand = 4 |
| 8 | 25 ns | 256 | 768 | 250 | Equiv. Time = ON | Expand = 2 |
| 9 | 50 ns | 128 | 784 | 500 | No decimation | Compress = 1:1 |
| 10 | 100 ns | 77 | 1312 | 1000 | No decimation | Compress = 2:1 |
| 11 | 200 ns | 31 | 1312 | 1000 | Decimate by 2 | Compress = 2:1 |
| 12 | 500 ns | 16 | 3264 | 2500 | Decimate by 2 | Compress = 5:1 |
| 13 | 1 $\mu s$ | 8 | 3264 | 2500 | Decimate by 4 | Compress = 5:1 |
| 14 | 2 $\mu s$ | 4 | 3264 | 2500 | Decimate by 8 | Compress = 5:1 |
| 15 | 5 $\mu s$ | 2 | 6336 | 5000 | Decimate by 10 | Compress = 10:1 |
| 16 | 10 $\mu s$ | 1 | 6336 | 10K | Decimate by 20 | Compress = 10:1 |
| 17 | 20 $\mu s$ | 1 | 12688 | 20K | Decimate by 20 | Compress = 20:1 |
| 18 | 50 $\mu s$ | 1 | 25392 | 25K | Decimate by 20 | Compress = 50:1 |
| 19 | 100 $\mu s$ | 1 | 50800 | 50K | Decimate by 20 | Compress = 100:1 |
| 20 | 200 $\mu s$ | 1 | 101552 | 100K | Decimate by 20 | Compress = 200:1 |
| 21 | 500 $\mu s$ | 1 | 256000 | 250K | Decimate by 20 | Compress = 500:1 |
| 22 | 1 ms | 1 | 512000 | 500K | Decimate by 20 | Compress = 1000:1 |
| 23 | 2 ms | 1 | 512000 | 500K | Decimate by 40 | Compress = 1000:1 |
| 24 | 5 ms | 1 | 512000 | 500K | Decimate by 100 | Compress = 1000:1 |
| 25 | 10 ms | 1 | 512000 | 500K | Decimate by 200 | Compress = 1000:1 |
| 26 | 20 ms | 1 | 512000 | 500K | Decimate by 400 | Compress = 1000:1 |
| 27 | 50 ms | 1 | 512000 | 500K | Decimate by 1000 | Compress = 1000:1 |
| 28 | 100 ms | 1 | 512000 | 500K | Decimate by 2000 | Compress = 1000:1 |
| 29 | 200 ms | 1 | 512000 | 500K | Decimate by 4000 | Compress = 1000:1 |
| 30 | 500 ms | 1 | 512000 | 500K | Decimate by 10000 | Compress = 1000:1 |

Table 1 contains the values used for different time-per-division settings. The leftmost column shown in Table 1 contains an index number that allows reference to particular rows and the sets of data that they contain. The next column, "Time-Per-Division", contains an entry for every horizontal setting of the first oscilloscope embodying the present invention. The "Count" column indicates how many acquisition records are used as input to each rasterization process at the corresponding "Time-per-Division" setting. In equivalent time operation (further described below), only one of the 256 records is processed during each rasterization cycle. However, the number of buffers in the memory, 256, is twice the number, 128, in the only comparable non-E.T. setting, index #9, 50 ns per division. The "Size" column indicates how many data points are stored in each rasterization record at this setting, while the "Used" column indicates how many data points are actually used in performing the rasterization.

The column, "E.T. or Decimation", contains information referring to the amount of "equivalent time" filling-in or decimation (effectively "throwing out") that will be performed by the acquisition hardware. Equivalent time sampling is a technique for effectively acquiring data through multiple acquisitions that corresponds to a sweep speed or sample rate that is actually faster than the acquisition hardware can perform. In the acquisition record produced by equivalent time sampling, anomalies may appear that result from the hypothetical nature of the acquisition record produced by the non-sequential acquisition of "successive" data points and the fact that the waveforms sampled to produce this record may not be perfectly repetitive.

The next-to-the-last column, "Expand/Compress", contains information that refers to the amount of expansion or compression that will be performed during the rasterization process. It is the combination of these factors, expansion and compression, and those from the preceding column, equivalent time filling in or decimation, that determine which samples contribute to the record in the acquisition memory 20 and ultimately which samples affect the rasterization result sent to the acquisition raster memory 40. For a single acquisition memory and rasterization section operating in its single channel mode, 6% of real time is spent acquiring, as compared with 94% spent processing the acquired acquisitions.

Index row #9, the 50 ns time-per-division row, contains the fastest real-time settings. All of the rows above row #9, those with Time-Per-Division settings faster than 50 ns per division, require the use of equivalent time sampling, i.e., the collection of multiple records and the use of only some data points from each one to build a composite data record. For instance, in row #0 the 200 ps per division is achieved by using only two data points each from 250 acquisitions. The oscilloscope is acquiring samples once every nanosecond, so only two data points per record are within the time frame of one record. At 200 ps per division on the horizontal timebase, and 10 divisions per display, each display is only 2 nanoseconds from side to side. By combining two samples each from 250 records, 500 records per display, can be composited into one equivalent time image.

In the rows below index #9, decimation is used to limit the record length and compression is used to shorten the distance taken up on the screen by the points contained in the record. For example, at 500 ms per division, the 10 division wide screen represents 5 seconds. At the one sample per nanosecond sample rate, 5 billion samples are available during that 5 seconds. Decimation by 10,000, allows 500, 000 data points to be collected. Compressing those 500,000 data points with a compression factor of 1000, produces 500 points per display and 50 points per division.

Referring again to FIG. 2, the data from the acquisition memory 20 that is specified by the address controller 31 is transferred to the data buffer 32. While the data buffer 32 can hold a total of 64×16 bytes of data, it actually receives only 8 bytes at a time every 16 ns. While the data buffer 32 is supplying one set of 8 bytes of acquisition data to the sample to vector converter 33, the other 8 bytes are being filled by the next transfer from the acquisition memory 20. 8 bytes per 16 ns equates to an average of 2 ns of access time per single sample point of acquired data.

The 8-bit data from acquisition memory 20 defines 256 vertical voltage levels, while the acquisition raster memory has vertical columns containing 200 pixels. Thus, there are 56 extra voltage levels defined by those 8-bit outputs which do not correspond to any of the 200 vertical pixel locations. Of those, 28 represent voltages below the bottom of the 200 vertical pixel locations corresponding to the display screen and 28 represent voltages that are above the 200 vertical pixel locations and the top of the screen. The screen typically shows a graticule with nine horizontal lines defining 8 vertical divisions of the display, each of which will receive data from 25 of the 200 pixels in each column of the acquisition raster memory 40. As will be further explained below, a one-to-two vertical expansion will occur before this data reaches the actual screen, so ultimately each vertical (and horizontal) division of the display will correspond to 50 pixels.

While the 28 top and 28 bottom values do not directly affect the 200 pixels in each column, as will be further explained below, they do exert an indirect effect by being used in the calculation that determines the slope of those vectors that will affect the 200 pixels in the present column. Affecting the slope calculation of a vector exerts an effect on the incremental intensity values that the pixels in that vector will receive.

The 28 top and bottom values also have one other effect. If a "clip-to-screen" function is active, and all of the current vector is in the top 28 or bottom 28 vertical is locations, i.e, all of the points in the current column are off the screen in one direction or the other, a special tag bit will be set in the 1st or 200th location in the acquisition raster memory 40 to indicate that condition.

Continuing with FIG. 2, the sample-to-vector converter 33 examines three sample data points, N, N−1, and N−2, in connection with producing each vector Top and Bottom signal. If all signal data were monotonic, two data points would be sufficient. However, the possibility of encountering inflection points in the data, necessitates the use of three points. The sample-to-vector converter 33 supplies a Hi and Lo signal to absolute value subtractor 34. The Hi and Lo signals can have a maximum difference of 255 vertical increments, since they are derived from the full span of values potentially defined by each 8-bit data sample. Absolute value subtractor 34 produces a vertical (or voltage) change value, dV, that it forwards to look-up table 35. Look-up table 35 uses the vertical change value, dV, to find an appropriate weight, W, for the present vector. In the presently described implementation, W can have values from 0 to 31. Generally, W has a value that bears an inverse relationship to dV/dT. For a particular time-per-division setting, dT will have a constant relationship to the distance represented by each column of pixels to be rasterized. For more information on how W may be calculated, refer to U.S. Pat. No. 5,550,963 to Siegel et al. for "Graded Display of Digitally Compressed Waveforms", hereby incorporated by reference.

Sample-to-vector converter 33 also supplies a pair of Top and Bot(tom) signals to the 200 counter block 36. These signals define, respectively, the values from 1 to 200 that define the length of the unsigned vector to be drawn as a result of the current sample data point. Each counter in the defined region is incremented by the value of W, the vector weight output of look-up table 35. It should be pointed out that the 8 bits of voltage amplitude data associated with one data point undergoes a potentially huge expansion during the process of rasterization. Since the location that it specifies can be up to a full vertical screen distance away from the location specified by the preceding data point, as many as 200 pixels can require updating as a result of the vectorization of one acquired data point. Since there are 19 bit counters and 4 tag bits, and these are later compressed into 21 bits of information at each of those 200 pixel locations, the total rasterization process for a single data point of 8 bits can affect the status of as many as 4,200 bits in the 21-bit acquisition raster memory 40. It thus becomes important to keep this data expansion from unnecessarily impeding the waveform throughput of the acquisition memory and rasterization section 200, and thereby that of the whole digital oscilloscope (given the availability of a limited number of such sections).

Figure 3:
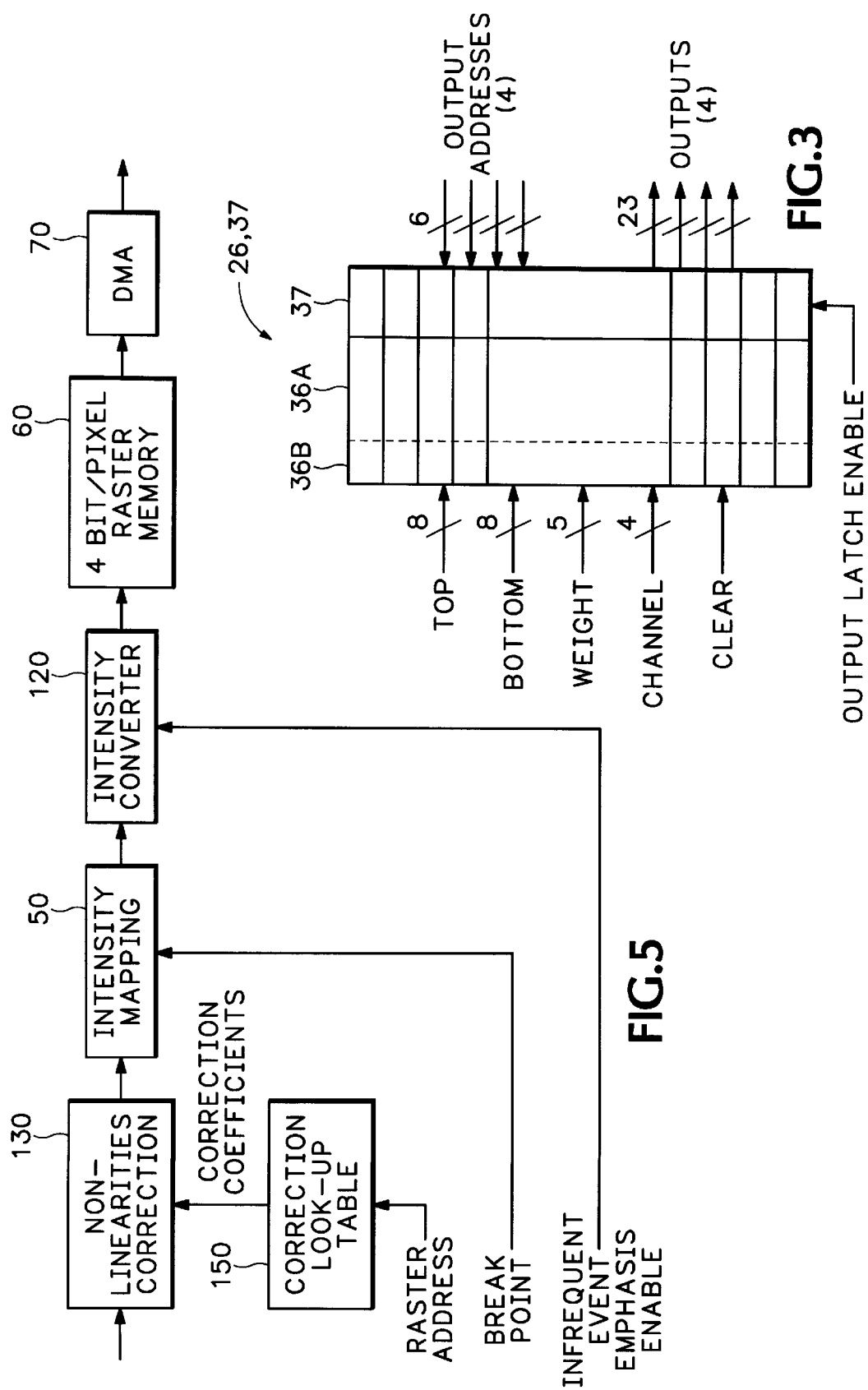
FIG. 3 is detailed block diagram showing the inputs, outputs, and subparts of the counter and latches block shown in FIGS. 2 & 4.

Referring now to FIG. 3, the 200 counter block 36 and latch 37 are shown in detail, along with their inputs and outputs. The left side portion of FIG. 3 is a bank of 200 4-bit channel tag registers 36B. The central portion of FIG. 3 is an array of 200 19-bit counters 36A. The 19-bit length of the counters in the counter block 36 is chosen in part for compatibility with the use of this same circuitry in another application. Because the maximum value of W is 31, and $2^{19}/31=16912$, the maximum compression factor resulting from this depth is 16,000.

Top and Bot(tom) input signals are each 8-bits long and identify one of the 200 19-bit counters. Weight, W, is a 5-bit signal that specifies the value from 0 to 31 by which each 19-bit counter in the vector defined by Top and Bot(tom) are to be incremented. The right side portion of FIG. 3 is a bank of 200 23-bit latches 37. These 200 23-bit latches 37 hold for output the contents of the both the 200 4-bit channel tag registers 36B and the array of 200 19-bit counters 36A, while those registers and counters are cleared (using the clear signal) and used to accumulate the next column of data. This array of counters is relatively expensive to implement and is typically able to draw vectors at a slower rate than sample data can be accessed from an acquisition memory. By including the latches 37 with these counters, it is possible to update a current column while drawing the next column into the counters, thereby avoiding any underutilization of this resource.

The 19 bits of intensity data in the bank of 200 23-bit latches 37 is added to the existing contents of the appropriate column of the acquisition raster memory 40 by adders 38, in a series of read-modify-write operations, as addresses are provided by raster address generator 45. The 4 bits of channel tags are OR-ed with corresponding bits from the acquisition raster memory 40, during the same read-modify-write operations. The channel identification bits, of which there are only enough to describe the number of channels multiplexed into one acquisition memory and rasterization section 200, are packed into the 21-bit pixels by sacrificing MSB's of intensity description capability.

When priority coding is used to determine the intensity at regions of channel overlap, there is lower throughput per channel, but a smaller necessary dynamic range. The worst case occurs when regions of overlap are added together for four channels (instead of the priority of the channels determining which intensity is displayed). There are then only 17 bits available for intensity information and they are saturated sooner because the overlapping intensities add. Since the maximum intensity update weight, W, is 31, the smallest number of updates that can produce saturation is $2^{17}/31=$ 4338. When acquiring 100,000 waveforms per second, needing an update every 4338 acquisitions implies a minimum required update rate of 23 times per second. Since the normal update rate will be between 30 and 60 times per second, this requirement will usually be easily satisfied. The channel identification is packed into the 21-bit pixels throwing away MSB's of intensity capability. Only the bits necessary to deal with the number of channels rasterized in one acquisition memory and rasterizer section 200 are sacrificed.

Acquisition raster memory 40 requires 268K bytes of memory to support a 200×500 array of pixels. 8 bytes of this memory are accessible simultaneously. Therefore, each access contains 21 bits of data for each of 3 pixels (with 1 bit wasted). A column of 200 pixels requires 67 accesses of 3 pixels each. Thus, 8(bytes/access)×67(accesses/column)× 500(columns/display)=268K(bytes/display).

Figure 4:
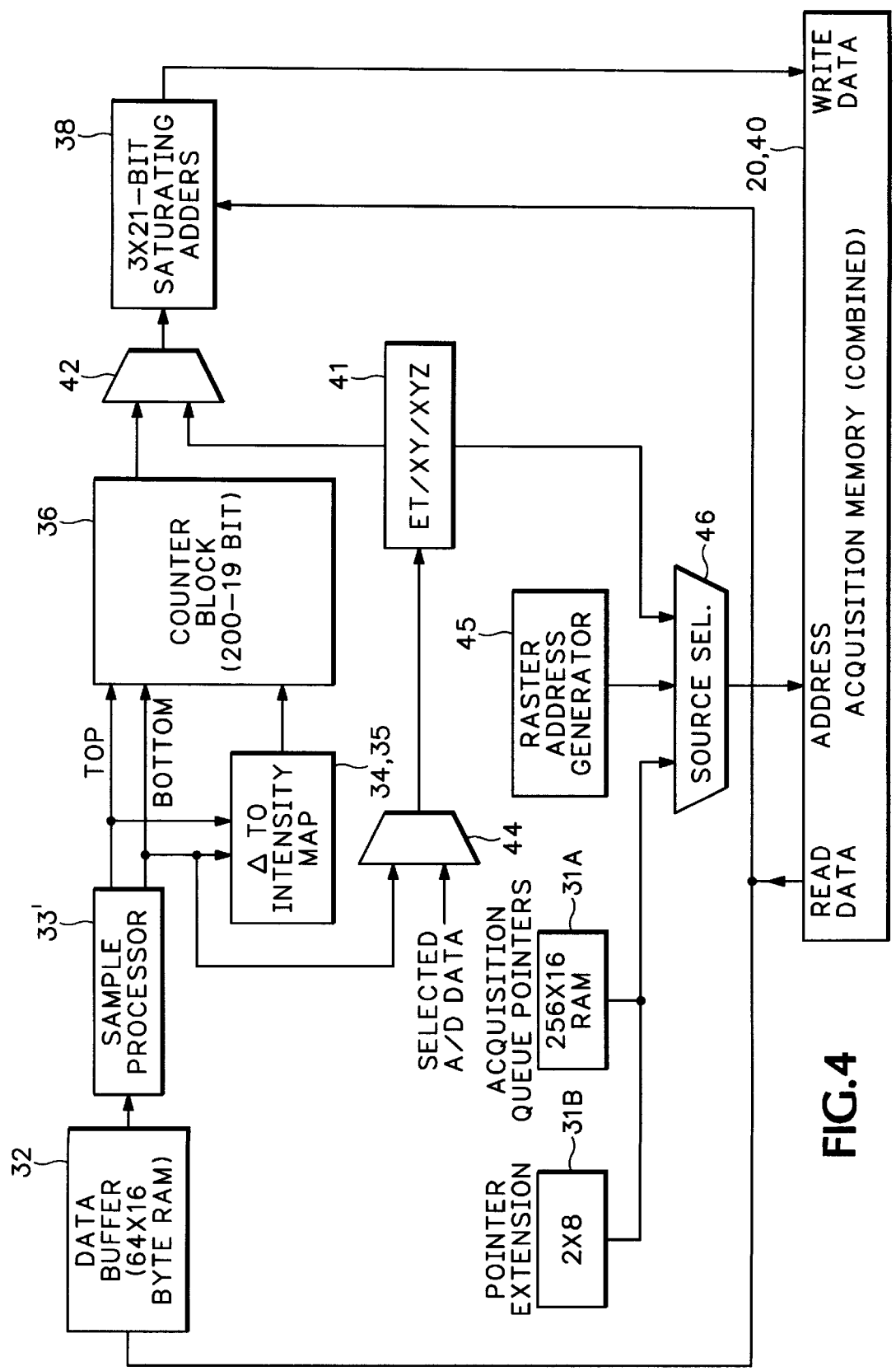
FIG. 4 is block diagram of a particular preferred embodiment of the variable intensity rasterizer.

Referring now to FIG. 4, in an actually constructed embodiment, it was found to be efficient to combine acquisition memory 20 and acquisition raster memory 40 in one large combined acquisition memory 20,40. Also, while until this point in the discussion, the description has been limited to conventional voltage-versus-time, or "YT", displays, it can be seen in FIG. 4 that other modes, such as "XY" and "XYZ", can also be integrated into one overall design. Address source selector 46 has as one of its sources ET/XY/XYZ addressing source 41, as well as raster address generator 45 and the two parts of address controller 31 (of FIG. 2) shown here as 256×16 RAM 31A and 2×8 pointer extension 31B. The pointer extension is supplied for rasterizing a single, >65536 buffer. Since the rasterization process operates on either a lot of small buffers, a single large buffer, or something in between, a tradeoff is made on wasting space with RAM vs. length and count that can be rasterized at one time.

Continuing the process of relating what is shown in FIG. 4 with what has been discussed above in FIG. 2, sample processor 33' corresponds to sample-to-vector converter 33. FIG. 4 does not show the distinction between the Top and Bot(tom) signals and the Hi and Lo signals that was made in FIG. 2, but does show that the Bottom signal is one of the potential inputs to addressing source ET/XY/XYZ 41 through multiplexer 44, which has as its other input "selected A/D data". "Selected A/D Data" is used in XY and XYZ modes, the data processor, acquisition data buffer, delta to intensity map, and acquisition queue pointers are not used in XY and XYZ modes. The delta-to-intensity map 34,35 and the counter block 36 are not used during equivalent time (ET) operations.

Adders 38 shown in FIG. 2 are shown in more detail in FIG. 4 as three instances of 21-bit saturating adders. Saturating adders do not overflow or produce MSB carries, but instead remain at a maximum value of all 1's when they become full. Read and write access to the (combined) acquisition memory 20,40 each take 16 ns and are 64 bits wide. Therefore, a Read-Modify-Write cycle can be performed on three 21-bit pixels every 32 ns. That is an average time of 10.67 ns per pixel update. Therefore, the longest that it can take to update all 200 pixels in a column is 67×32 ns or 2.144 μs. Thus, if the input data for each column includes 134×8/7=154 data points from the acquisition memory 20, the acquisition raster memory 40 update time will not limit the rasterization speed and the rasterization process speed itself becomes the limiting factor. Since the (combined) acquisition memory 20,40 can accessed to provide 8 bytes in parallel every 16 ns, it is possible to read acquisition waveform data 8 times faster than it can be processed. Because the data buffer 32 can hold up to 128 8-byte acquisition segments for parallel processing, 87.5% of the (combined) acquisition memory bandwidth is available for updating the acquisition raster memory with the output of the rasterization process.

If, as in this design, the number of pixels per column is 200 (M=200 pixels/column), and the average time required to update each pixel is 10.67 ns (P=10.67 ns/pixel-update), the throughput rate of the rasterizer is 2.134 μs/column (M*P=2.134 μs/column). Then, if the time to draw the vector based on a single new data point is 16 ns (D=16 ns/sample-pair), and the average time required to access a single sample pair of acquisition data is 2 ns (A=2 ns), the available time for updating the acquisition raster memory is D-A, or 14 ns. Thus, the maximum combination N*C, of acquisition pixels per column, N, and compression pixels within each column, C, that should be used to keep the rasterizer fully occupied (assuming the availability of sufficient triggers) is: N*C=(M*P)/(D-A), or N*C=(2134 ns/column)/14 ns, or N*C=152.4 pixels. And, if the appropriate compression factor, C, is known, N can be calculated according to: N>152.4/C. This efficiency function is specific to the design shown in FIG. 4, where the output bandwidth and input bandwidth share a single overall memory bandwidth, i.e., A subtracts from D.

A more general efficiency function arises in connection with FIG. 2, where the input and output bandwidths are independent of each other. In that case, the ideal number of acquisitions N, when C, P, and M are determined, is: N=(M*P)/(C*D). By designing and programming an oscilloscope rasterizer in this way, it is possible to supply images to the screen at a constant samples/sec rate at all time/divs when there are a sufficient number of triggers. In order to maintain a uniform acquisition rate, it is important to have twice as many acquisition buffers as are used in a single pass of rasterization. In this way, acquisitions may continue into the buffers which are not currently being rasterized. These buffers may either be arranged as two banks that are alternately acquired and rasterized, or as a circular queue of buffers with rasterization starting on a display update deadline or when the desired number of records have been acquired.

Referring again to FIG. 1, the contents of 200×500 21-bit-per-pixel acquisition raster memory 40 is then "mapped" 50 into a second, shorter depth, 4-bit-per-pixel acquisition raster memory 60 having the same planar (200× 500) dimensions. This shorter 4-bit-per-pixel acquisition raster memory 60 still contains 200×500 pixel locations, but each pixel only has 4-bits-per-pixel of intensity information associated with it, and consequently can only display 16 levels of intensity. This "mapping" 50 is accomplished by the use of 15 breakpoints that (monotonically) define the boundaries of the 16 intensity levels. In one embodiment, the mapper 50 is configured to process three 21-bit pixel value inputs in parallel every 16 ns. This approach requires that there be several pipeline delays between the 16 ns read of three 21-bit pixel values and the corresponding 16 ns writes of five groups of three 4-bit pixel value outputs into the 8-byte wide memory. Because the mapping operation depends on using data stored with in the acquisition raster memory 40, exporting that data is another constraint on the overall utilization of that limited bandwidth. Exporting the data for the mapping uses about 600 μs for each display update or about 0.6 ms/30 ms. This results in a 2% drag on the efficiency of the rasterization process.

The contents of the short 4-bits-per-pixel acquisition raster memory 60 are transferred to a raster combiner 80 in the display section 300 by a direct memory access (DMA) process 70. The display section 300 contains two display raster memories 90 and 100. These raster memories can also be 4-bits-per-pixel, or can include additional bits for channel identification and coloring. Four tag bits can identify up to four individual channels or 16 combinations of channels.

While one 90 of two display raster memories 90 and 100 are supplying the raster display 110 with data for the current display, its contents are also being combined with the contents of the short 4-bits-per-pixel acquisition raster memory 60 by the raster combiner 80. The output of that process is stored in the other display raster memory 100. During the vertical retrace time of the display 110, the two display raster memories 90 and 100 are functionally swapped, and the raster combiner 80 output is then stored in the opposite display raster memory 90 while its input and that of the raster display 110 are provided display raster memory 100. During the raster combining process, the 200 vertical locations of the acquisition raster memories are expanded to 400 such locations in the two display raster memories 90 and 100. In a simple embodiment, this is accomplished by duplication of each line of data, although more sophisticated means, such as averaging a line above and a line below, could be employed if so desired.

While in one implementation each acquisition memory and rasterization section 200 only handles data associated with one channel of the oscilloscope, in an alternative embodiment it is possible to put data from multiple channels into a single acquisition memory and rasterization section 200. When this is done, samples from different channels are interleaved in each "acquisition" memory record, so that each sample from a particular channel is a constant and predetermined number of locations apart in the data record. Harking back to the terminology of analog oscilloscopes, in which it was possible to have a "chopped" view of two or more signals displayed by the multiplexed use of a single horizontal timebase, this way of using the acquisition memory and rasterization sections 200 is referred to as "chop" mode. When data from different channels is interleaved in the chop mode, the data associated with individual channels is "tagged" by the rasterization process 40 in extra bits associated with each pixel, so that it may later be determined which channels have affected the contents of each pixel. In the 200 counter block 36 there are four extra bits for channel tagging besides the 19-bits that are part of the counters.

To maintain maximum throughput in the system described above, acquisitions are processed in batches. To keep the flow of acquisition data constantly available to the rasterization process at the necessary speed, the next acquisition must be started after the average single acquisition rasterization time has elapsed since the end of the previous acquisition. However, acquisitions start by sampling data and moving it into the acquisition memory, without knowing when, or even if, the next trigger will ever occur. Yet, the goal of the acquisition memory and rasterization section 200 is to keep data flowing toward the display section 300 without any perceptible interruption. Therefore, the rasterization process 30 cannot engage in indefinite waiting for a trigger to be received, if its ability to continue outputting data is rendered impossible by that course of action.

To deal with this problem, the process controller 180 keeps track of the time that passes after the next acquisition should have become available but has not done so. When such a "late trigger interval" has elapsed, the process controller 180 queries the trigger circuitry 15 to see if a trigger has been received yet.

If a trigger has been received, there is no point in abandoning an acquisition that will soon be completed in any event. However, if no trigger has been received, and the process controller 180 does not receive a "trigger received" signal from the trigger circuitry 15 in response to its query, it "aborts" the current acquisition process and forwards the partial results to the intensity mapping circuitry 50 (via the non-linearities correction circuitry 130 if present). Typically, the late trigger interval is on the order of 10 times the length of time between successive acquisitions. This permits slow triggers with a uniform distribution to be detected about 90% of the time. This solution creates another problem in the presence of periodic slow triggers arriving at an interval that is about equal to the normal acquisition delay plus the late trigger interval. To avoid missing almost all these triggers, the late trigger interval can be made to vary randomly over some period of time, e.g., from 50% to 150% of the 10 times the normal acquisition rate number.

The design described above, with its deep statistical database of the 21-bit-per-pixel acquisition raster memory 40 and the high through-put variable intensity rasterization process 30 that supplies it with data, makes visible artifacts that are not seen in prior art rasterizers. Specifically, A/D differential non-linearity (A/D DNL) from the acquisition process 10 can result in horizontal banding becoming visible in the display 110. Also, when timebase selections require the use of equivalent time settings, time interpolator non-linearities (TINL) can show up in the display 110 as vertical banding.

Figure 6A:
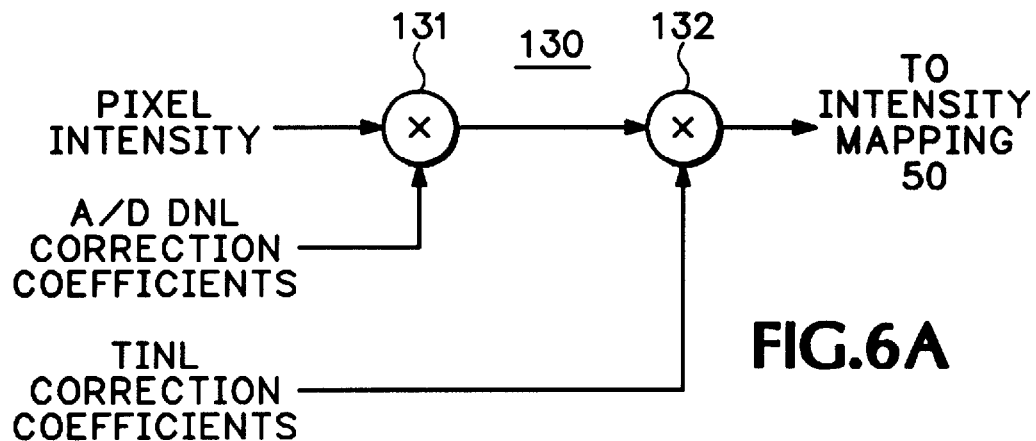
FIGS. 6A & 6B are block diagrams showing two ways that non-linearity correction can be performed.
Figure 6B:
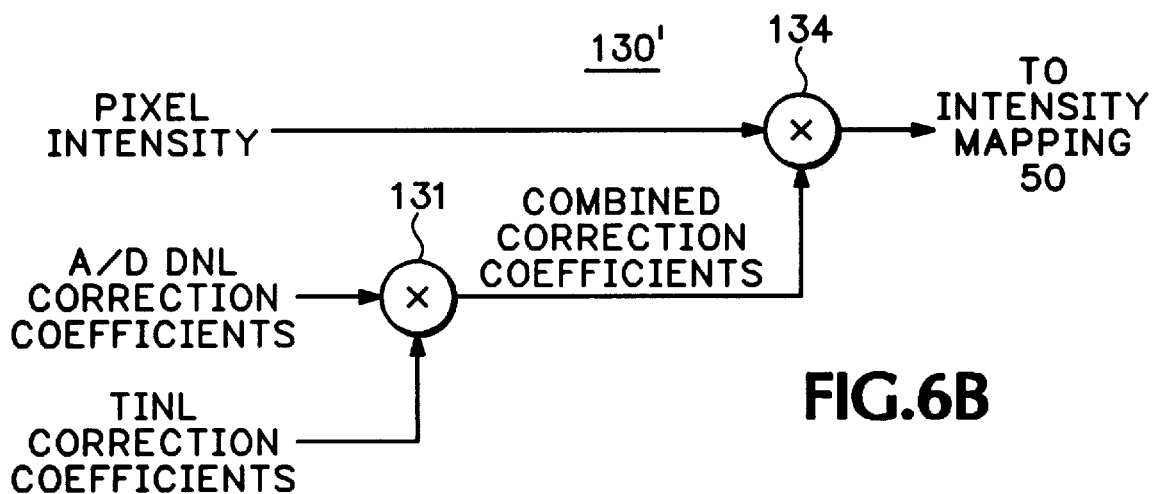

Referring first to FIG. 5, non-linearity correction circuitry 130 can be used to allow compensation for these factors as the pixel intensity data moves from the acquisition raster memory 40 to the intensity mapping process 50. Referring next to FIGS. 6A and 6B, individual pixel intensities can be successively multiplied by correction coefficients for the A/D differential non-linearities with multiplier 131 and the time interpolation non-linearities with multiplier 132, as shown in FIG. 6A, or the A/D DNL and TINL correction coefficients can be multiplied by each other first 133 and then the combined correction coefficients can be applied to the pixel intensities by multiplier 134 as shown in FIG. 6B.

Returning to FIG. 5, the correction coefficients are supplied to the non-linearities correction circuitry 130 by correction look-up table 150. As the correction coefficients, both A/D DNL and TINL, may both vary on a pixel-by-pixel basis, the correction look-up table 150 is accessed by raster addresses from the raster address generator 45 shown in FIG. 2 (with suitable delay, if needed). If linearity correction is employed, the input to the intensity mapping circuitry 50 will be from the output of multiplier 132 of FIG. 6A or from that of multiplier 134 of FIG. 6B, one or the other of which is shown as the non-linearity correction block in FIG. 5.

The correction coefficients needed for the correction look-up table 150 can be determined at the factory or by built-in instrument calibration software. If the DNL and TINL are stable with instrument age and temperature, then a set of factory determined values would be sufficient. Otherwise, instrument signal path compensation software could do the calibration at user request when enhanced accuracy is desired.

Determining the A/D DNL compensation coefficients could be accomplished by supplying an ideal sine wave or some other known ideal waveform to the A/D, digitize it, and accumulate the statistics for hit rate for each digitizing level. The acquired statistics for the proportion of time that the waveform was at each voltage level can be compared to known statisitics for the ideal waveform to determine suitable correction coefficients to make the statistics match.

To determine the correction coefficients for the time interpolator non-linearity, a fast trigger, asynchronous to the scope, should be supplied to the trigger circuitry, and a histogram profile of the distribution of the hits compared with the uniform average level that would be expected of an ideal perfectly linear time interpolator. Again, suitable compensation factors would bring the actual data into conformity with the ideal.

Performing a linear intensity accumulation of the acquired data, according to the rasterization method described above, means that the general level of accumulated intensities is directly proportional to the number of acquisitions accumulated. This raster is periodically cleared or decayed each time the screen is updated. If the time between updates is not constant, as it frequently may not be due to other processor activity, other display activity, or data dependent raster copying times, a fixed scaling of the accumulated acquisition raster memory contents can lead to observable, non-signal related intensity variations. Also, if an exponential decay is applied to the accumulating acquisition raster memory contents between display updates, there will be an initial transient build up of overall intensities in the map until a status quo is reached. These effects are all unwanted artifacts that it would be desirable to eliminate.

While a linear accumulation of acquisitions into intensity variations is the easiest to produce at the rasterizer end of the process, an optimal presentation from the user's perspective might be more non-linear. For example, the user might sometimes be strongly focused on the most infrequent events and therefore might want to have all non-zero pixels mapped to the brightest intensity that the display can produce. Alternatively, there might be a certain region of pixel hit rates, and corresponding accumulated intensity, that the user would like to map to the full range of dynamic intensity available in order to more clearly distinguish subtle differences in the frequency at which they are being affected by acquired data.

Both of the above sets of goals can be addressed with a user controllable intensity mapping function that allows control of the gain and offset of the transfer curve. From the user's point of view such controls could appear, respectively, as contrast and brightness. The means by which the transfer function can be modified, when it is implemented as shown and described in FIG. 7 below, is by controlling the magnitude of a maximum pixel intensity reference value and controlling the size of the fifteen break point fractions that make up the mapping function. Each of the fifteen break points is determined by multiplying the corresponding fraction times the maximum pixel intensity reference value. The fractions define a normalized transfer function that the user can modify, while the maximum pixel intensity value provides scaling for the expected data accumulations in the acquisition raster memory.

Figure 7:
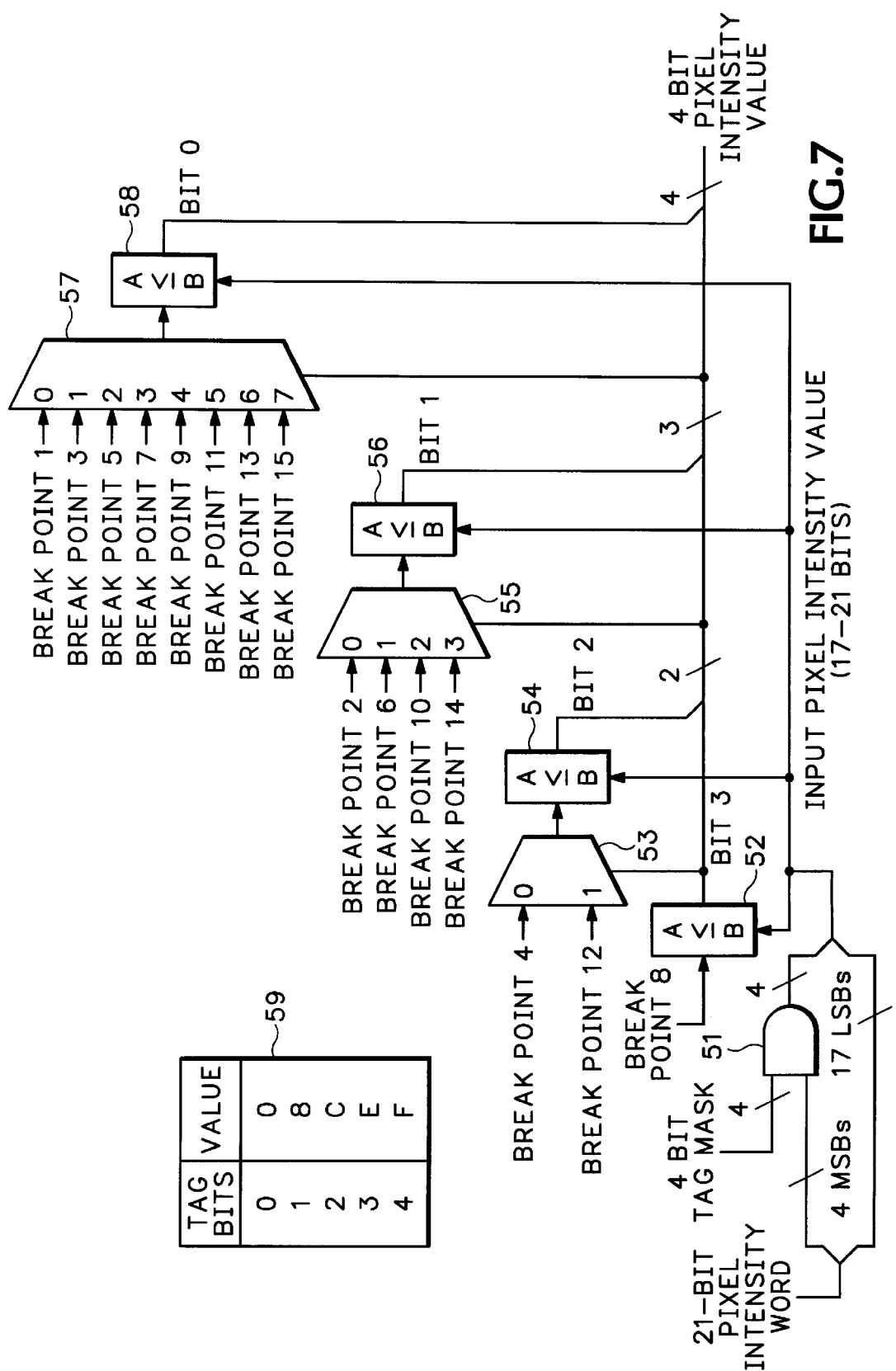
FIG. 7 is a schematic diagram of the intensity mapper circuit for accomplishing bit-per-pixel reduction in a manner in which the scaling and gain is controllable.

Referring now to FIGS. 5 & 7, the intensity mapping process 50 is controlled by break point values. FIG. 7 shows how these break points are used in the intensity mapper circuit to accomplish bit-per-pixel reduction in a desired manner. The assignment of 15 break point values determines the boundaries of the 16 intensity levels that will be produced by the 4-bit-per-pixel mapping.

The circuitry shown in FIG. 7 operates as a successive approximation digitizer as it reduces the bit count of the pixels. First, however, the 21-bit pixel intensity word must be trimmed to eliminate any tag bits. As tag bits, if present, will be the most significant bits (MSBs), and there will at most be four of them, the four MSBs are ANDed with a 4-bit tag mask by AND gates 51. The TagBits/Value table 59 shows how the number of tag bits present, shown in the left column, are masked out by bits representing the hexadecimal value shown at the right, thereby producing 17 to 21 bits that are all representative of the input pixel intensity value.

The input pixel intensity value is compared 52 with Break Point 8, which has a value corresponding to the MSB of the number of bits in the masked input pixel intensity value, i.e., one half of the maximum input pixel intensity value. If the input pixel intensity value is larger than the value of Break Point 8, Bit 3 (the MSB) of the mapped-to 4-bit pixel intensity value will be one. Conversely, if the input pixel intensity value is smaller than the value of Break Point 8, Bit 3 (the MSB) of the mapped-to 4-bit pixel intensity value will be zero. In similar fashion, the input pixel intensity value is compared 54 with either Break Point 4 or Break Point 12, representing ¼ and ¾, respectively, of the input pixel intensity value range to determine Bit 2 of the mapped-to 4-bit pixel intensity value. Whether the compared-with value is ¼ or ¾ depends on which output of multiplexer 53 is selected by the outcome of the previous comparison 52.

Similarly, the results of the first two comparisons 52,54 select which output of multiplexer 55 the input pixel intensity value is to be compared 56 with, Break Point 2, 6, 10, or 14, representing, respectively, ⅛, ⅜, ⅝, or ⅞ of the maximum input intensity value. The result of this comparision 56 is Bit 1 of the mapped-to 4-bit intensity value. This process is repeated one additional time, with the output of multiplexer 57 being one of Break Points 1, 3, 5, 7, 9, 11, 13, or 15, depending on the outcome of the first three comparisons 52,54,56, and with that output being compared 58 with the input pixel intensity value to determine the state of Bit 0. The output of this process, which can also be characterized as a binary search to locate mapped-to bins, is the 4-bit pixel intensity value.

While the input pixel intensity values and the break points are normally all 21 bit integers, if there are tag bits, the MSBs of the input pixel intensity values are forced to zero and the break points are made to be restricted in range. This scales all of the break points down to being a fraction of the reduced-in-value maximum pixel intensity reference value.

Other implementations than the one shown in detail above could used to perform the actual mapping. A hardware or software implemented lookup table, or software algorithm implementing a binary search or some other sorting fuction could also be used to convert input pixel intensity values into output pixel intensity values based on the break points and fractions that they represent. The most important aspect and real value of the invention is in being able to vary the magnitude of the maximum pixel intensity reference value in various ways and also in being able to variously define the break points and thereby shape the transfer function between the two pixel intensity representations. The number of input bits and output bits can be varied, so long as the number of output bits is smaller than the number of input bits. The number N of possible output intensity values could be other than a power of two. The number of fractions and break points used to implement the transfer could be less than N−1, thereby altering and partially collapsing the symmetry of the mapping function.

There are also a number of interesting possible ways to establish the maximum pixel reference value, in addition to simply determining the maximum pixel intensity value that can be represented by the greater number of input bits. The operator could be permitted to set the maximum pixel intensity reference value through the use of a "brightness" control. The alternative actually implemented allows the operator to select between an "Autobrightness ON" mode and an "Autobrightness OFF" mode. In the Autobrightness ON mode, the maximum pixel reference value can be made a function of the actual intensity value of the largest input pixel intensity value, as measured by hardware or software somewhere in the data path. Conversely, in the Autobrightness OFF mode, the maximum pixel reference value can be made a function of an amount of time that intensity data has been accumulating into acquisition raster memory 40. While the foregoing use of the Autobrightness mode concept presently appears to be the preferred embodiment, the ON mode could depend on some factor other than the actual intensity value of the largest input pixel intensity value, or the OFF mode could depend on some other factor than time acquired.

The maximum pixel intensity reference value can also be made a function of the average pixel intensity value of the pixels stored in the acquisition raster memory 40. Alternatively, the maximum pixel intensity reference value can also be made a function of the average non-zero pixel intensity value of the pixels stored in the acquisition raster memory 40.

In the case of Autobright OFF as it is originally discussed above, the maximum pixel value used is a theoretical maximum pixel intensity value which is directly proportional to the amount of time that acquisitions have been accumulated into the image. This Autobrite OFF option causes the overall process to duplicate an artifact of analog oscilloscopes, namely that the display intensity depends on the user's trigger rate. In some circumstances, this conveys additional information to the user, specifically a qualitative indication of signal rate. In other circumstances, this behavior may be objectionable, thus the alternative of Autobright ON and automatically scaling all events to actual full intensity. The use of a theoretical maximum pixel intensity based only on the time used for acquisition can lead to a mismatch of the image presented as compared with an image derived from the use of scaling based on the actual maximum pixel intensity received. Normally, when plenty of triggers are available, the system would be expected to produce the same image without regard to which of these references is used. In practice, they may be very different and it is desirable to allow the user to control which is used.

Depending on the maximum slew rate present, a wide dynamic range of maximum pixel intensity will occur. For example, the maximum pixel intensity value for a signal that remains at a constant voltage level will be 200 times as large as that of a signal that spans all 200 voltage levels of the display in the time associated with one pixel column. This variation of overall intensity level will become much larger if the dv/dt weighting factor W is being applied. This weighting factor W produces another factor of 31:1 in intensity difference between signals with maximum and no vertical change, making the overall intensity difference factor 6200:1. One method to compensate for this signal related (as opposed to trigger related) intensity variation is to multiply the time based theoretical maximum pixel intensity by an efficiency factor. This efficiency factor is based on the ratio of the actual maximum pixel intensity to the expected theoretical maximum pixel intensity, which is itself equal to the compression factor times the acquisition count. In total then, the system computes the theoreticalMaxPixIntensity=acquistionCount* scaleFactor* (actualMaxPixlntensity/ (acquisitionTime*compressionFactor)).

Yet another alternative for the computation of the maximum pixel intensity reference value is to base it on the average non-zero pixel intensity or the average pixel intensity including zero pixels. In one implementation the hardware includes means for counting all of the non-zero pixels and the sum of all pixel intensities, allowing either of these approaches to be used.

Referring again to FIG. 5, the output of intensity mapping 50 is next operated upon by intensity converter 120 if, but only if, the infrequent events emphasis enable signal is active. This signal is activated by operator control when the operator want to emphasize infrequent events and de-emphasize more frequent ones. When enabled, intensity converter 120 modifies pixel brightness to emphasize infrequent events. In its simplest implementation this can mean complementing all non-zero pixel intensities. This makes the least bright pixels into the brightest, and the most bright pixels into the dimmest. Pixels of intermediate brightness are minimally affected or not affected at all. Other, more complex algorithms could be employed using a look-up table or tables. The creation or selection of his table can be under the user's control, and could include mappings that allow the user to highlight by choosing among frequencies of occurrence, either with intensity or color.

While a preferred embodiment of the present invention has been shown and described, it will be apparent to those skilled in the art that many changes and modifications may be made without departing from the invention in its broader aspects. The claims that follow are therefore intended to cover all such changes and modifications as are permitted by the patents laws of the respective countries in which this patent is granted.

What is claimed is:

1. A method for emphasizing infrequent events in variable intensity or variable color displays of waveform images, the method comprising the steps of:

(a) producing variable intensity raster memory contents representative of the behavior of a plurality of successive instances of an electrical waveform's behavior, said behavior being predominantly repetitive but including instances of behavior that is at least partially variant, with the highest intensity values of said raster memory contents being at least partially associated with highly repetitive occurrences of identical waveform images, and with the lowest intensity values being at least partially associated with relatively rare occurrences of at least partially variant versions of the waveform image; and (b) in a normal mode of operation, providing the raster memory contents to a raster display system for presentation to a user as a variable intensity display, said raster display system having a memory subject to digital persistence control for decaying the intensity of each pixel; and (c) in an alternative mode of operation, complementing non-zero pixel intensity values to convert low intensity ones of said pixel values to high intensity values and to convert high intensity ones of said pixel values to low intensity values, and then providing the raster memory contents to a raster display system for presentation to a user as a variable intensity display, said raster display system having a memory subject to digital persistence control for decaying the intensity of each pixel.

2. A method according to claim 1 wherein the alternative mode of operation is selected by a first action of a user and deselected by a second action of a user.

3. A method according to claim 1 wherein the alternative mode of operation is selected by an action of a user and deselected by a cessation of the action.

4. A method according to claim 1 wherein the alternative mode of operation is selected by a user and deselected by a timer after a predetermined time following the selection.

5. A method for emphasizing infrequent events in variable intensity or variable color displays of waveform images, the method comprising the steps of:

(a) producing variable intensity raster memory contents representative of the behavior of a plurality of successive instances of an electrical waveform's behavior, said behavior being predominantly repetitive but including instances of behavior that is at least partially variant, with the highest intensity values of said raster memory contents being at least partially associated with highly repetitive occurrences of identical waveform images, and with the lowest intensity values being at least partially associated with relatively rare occurrences of at least partially variant versions of the waveform image; and (b) in a normal mode of operation, providing the raster memory contents to a raster display system for presentation to a user as a variable intensity display, said raster display system having a memory subject to digital persistence control for decaying the intensity of each pixel; and (c) in an alternative mode of operation, converting non-zero pixel intensity values from low intensity ones of said pixel values to high intensity values and to convert high intensity ones of said pixel values to low intensity values, and then providing the raster memory contents to a raster display system for presentation to a user as a variable intensity display, said raster display system having a memory subject to digital persistence control for decaying the intensity of each pixel;

wherein the converting of step (c) comprises the step of referring to a look-up table.

* * * * *